United States Patent
Cho et al.

(10) Patent No.: US 7,204,669 B2
(45) Date of Patent: Apr. 17, 2007

(54) SEMICONDUCTOR SUBSTRATE DAMAGE PROTECTION SYSTEM

(75) Inventors: Sungmin Cho, Menlo Park, CA (US); Peter Reimer, Los Altos, CA (US); Vincent Seidl, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 856 days.

(21) Appl. No.: 10/198,688

(22) Filed: Jul. 17, 2002

(65) Prior Publication Data

US 2004/0013499 A1  Jan. 22, 2004

(51) Int. Cl.
*B65G 49/07* (2006.01)

(52) U.S. Cl. .................................... 414/800

(58) Field of Classification Search ............. 414/217.1, 414/805, 811
See application file for complete search history.

(56) References Cited

U.S. PATENT DOCUMENTS

| | | | |
|---|---|---|---|
| 6,042,324 A | 3/2000 | Aggarwal et al. | 414/411 |
| 6,053,688 A | 4/2000 | Cheng | 414/416 |
| 6,082,951 A | 7/2000 | Nering et al. | 414/217.1 |

(Continued)

FOREIGN PATENT DOCUMENTS

EP    1 098 351 A2    5/2001

(Continued)

OTHER PUBLICATIONS

PCT Invitation to Pay Additional Fees based on International Application No. PCT/US03/22367, dated Dec. 3, 2003.

*Primary Examiner*—James W. Keenan
(74) *Attorney, Agent, or Firm*—Patterson & Sheridan, LLP

(57) ABSTRACT

A method and apparatus for preventing substrate damage in a factory interface. In one embodiment, a method for preventing substrate damage in a factory interface includes the steps of receiving an indicia of potential substrate damage, and automatically preventing substrates from moving out of a substrate storage cassette in response to the received indicia. The indicia may be a seismic warning signal, among others. In another embodiment, a method for preventing substrate damage in a factory interface includes the steps of moving a pod door in a first direction to a position spaced-apart and adjacent a pod, and moving the pod door laterally in a second direction to close the pod. The lateral closing motion of the pod door urges substrates, which may be misaligned in the pod, into a predefined position within the pod.

17 Claims, 8 Drawing Sheets

U.S. PATENT DOCUMENTS

| | | | |
|---|---|---|---|
| 6,098,809 A | 8/2000 | Okada et al. | 206/711 |
| 6,164,894 A | 12/2000 | Cheng | 414/416 |
| 6,165,268 A | 12/2000 | Ow et al. | 118/500 |
| 6,186,723 B1 | 2/2001 | Murata et al. | 414/217 |
| 6,188,323 B1* | 2/2001 | Rosenquist et al. | 340/686.5 |
| 6,244,812 B1 | 6/2001 | Patterson et al. | 414/416 |
| 6,249,342 B1 | 6/2001 | Cheng | 356/237.2 |
| 6,257,827 B1 | 7/2001 | Hendrickson et al. | 414/805 |
| 6,283,692 B1 | 9/2001 | Perlov et al. | |
| 6,297,746 B1* | 10/2001 | Nakazawa et al. | 340/825.69 |
| 6,318,945 B1 | 11/2001 | Hofmeister | 414/217 |
| 6,322,633 B1 | 11/2001 | Bexten et al. | 134/1 |
| 6,425,722 B1* | 7/2002 | Ueda et al. | 414/217 |
| 6,427,096 B1* | 7/2002 | Lewis et al. | 700/228 |
| 6,540,469 B2* | 4/2003 | Matsunaga et al. | 414/416.08 |
| 6,573,198 B2* | 6/2003 | Boonstra et al. | 438/795 |
| 6,670,889 B2* | 12/2003 | Luan et al. | 340/690 |
| 6,901,971 B2* | 6/2005 | Speasl et al. | 141/1 |
| 2003/0069002 A1* | 4/2003 | Hunter et al. | 455/404 |
| 2004/0013498 A1* | 1/2004 | Soucy et al. | 414/217 |
| 2004/0120797 A1* | 6/2004 | Paul et al. | 414/217.1 |

FOREIGN PATENT DOCUMENTS

| | | | |
|---|---|---|---|
| JP | 10-242095 | * | 9/1998 |
| WO | WO 99/38200 | | 7/1999 |

* cited by examiner

SEMICONDUCTOR SUBSTRATE DAMAGE PROTECTION SYSTEM

FIELD OF THE INVENTION

Embodiments of the invention generally relate to a semiconductor substrate damage prevention system.

BACKGROUND OF THE RELATED ART

Semiconductor substrates are generally stored and transported in substrate storage cassettes. A typically substrate storage cassette includes a plurality of substrate support slots arranged to hold substrates in a spaced-apart, vertically-stacked orientation within a housing. In many systems, the housing, also known as a pod, includes a sealable door that allows the substrate stored within the cassette to be isolated from the surrounding environment. The ability to isolate the interior of the substrate storage cassette from the surrounding environment is particularly important when substrates are transported between fabrication tools in order to minimize potential particulate contamination.

Substrate storage cassettes are typically coupled to a fabrication tool at a factory interface. The factory interface includes one or more bays, each configured to accept one substrate storage cassette. In order to maintain isolation of the environment surrounding the substrates stored inside the substrate storage cassette, each bay is equipped with a pod door opener (PDO). The PDO the door of the pod from within the factory interface while maintaining a seal between the factory interface and the substrate storage cassette, thus maintaining isolation of the substrates from the surrounding environment.

Occasionally during the docking and door-opening procedure, one or more of substrates within the substrate storage cassette may inadvertently move laterally toward the factory interface. Once the substrate is moved out of position within the substrate storage cassette, the substrate is highly likely to become damaged or create other processing problems. For example, a misaligned substrate may be hit by another substrate being removed or returned to the substrate storage cassette, thereby causing damage to one or both of the substrates. Additionally, the misaligned substrate may not be positioned correctly on the blade of the transfer robot, thus potentially becoming disengaged from the robot blade during transfer, or becoming misaligned or damaged while being positioned in the next transfer area, or creating orientation/alignment problems during substrate processing.

Therefore, there is a need for a method and apparatus for operating a pod door to mitigate substrate misalignment and prevent substrate damage.

SUMMARY OF THE INVENTION

Embodiments of the invention provide a method and apparatus for preventing substrate damage in a factory interface. In one embodiment, a method for preventing substrate damage in a factory interface includes the steps of receiving an indicia of potential substrate damage, and automatically preventing substrates from moving out of a substrate storage cassette in response to the received indicia. The indicia may be a seismic warning signal, among others.

In another embodiment, a method for preventing substrate damage in a factory interface includes the steps of moving a pod door in a first direction to a position spaced-apart and adjacent a pod, and moving the pod door laterally in a second direction to close the pod. The lateral closing motion of the pod door urges substrates, which may be misaligned in the pod, into a predefined position within the pod.

In another embodiment, a method for docking a substrate storage pod to a factory interface is provided. The method for docking a substrate storage pod to a factory interface includes placing a substrate storage pod on a docking station in a first orientation, coupling the wafer storage pod to the docking station, moving the coupled substrate storage pod to a position abutting the factory interface, and rotating the substrate storage pod during the moving step.

In another aspect of the invention, an apparatus for docking a substrate storage pod to a factory interface is provided. In one embodiment, an apparatus for docking a substrate storage pod to a factory interface includes a docking station having a substantially horizontal flange extending from a substantially vertical wall. The wall has an aperture formed therethrough. A stage is movably coupled to the flange and adapted to support the substrate storage pod. An engagement mechanism and docking actuator are coupled to the stage. The engagement mechanism is adapted to secure the substrate storage pod to the stage. The docking actuator is adapted to move substrate storage cassette against the bay. A release mechanism is adapted to decouple at least one of the engagement mechanism from the pod or the stage from the docking actuator, thereby facilitating access to the pod in the event of one or more of the actuators becoming immobilized.

BRIEF DESCRIPTION OF THE DRAWINGS

So that the manner in which the above recited features of the present invention are attained and can be understood in detail, a more particular description of the invention, briefly summarized above, may be had by reference to the embodiment thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
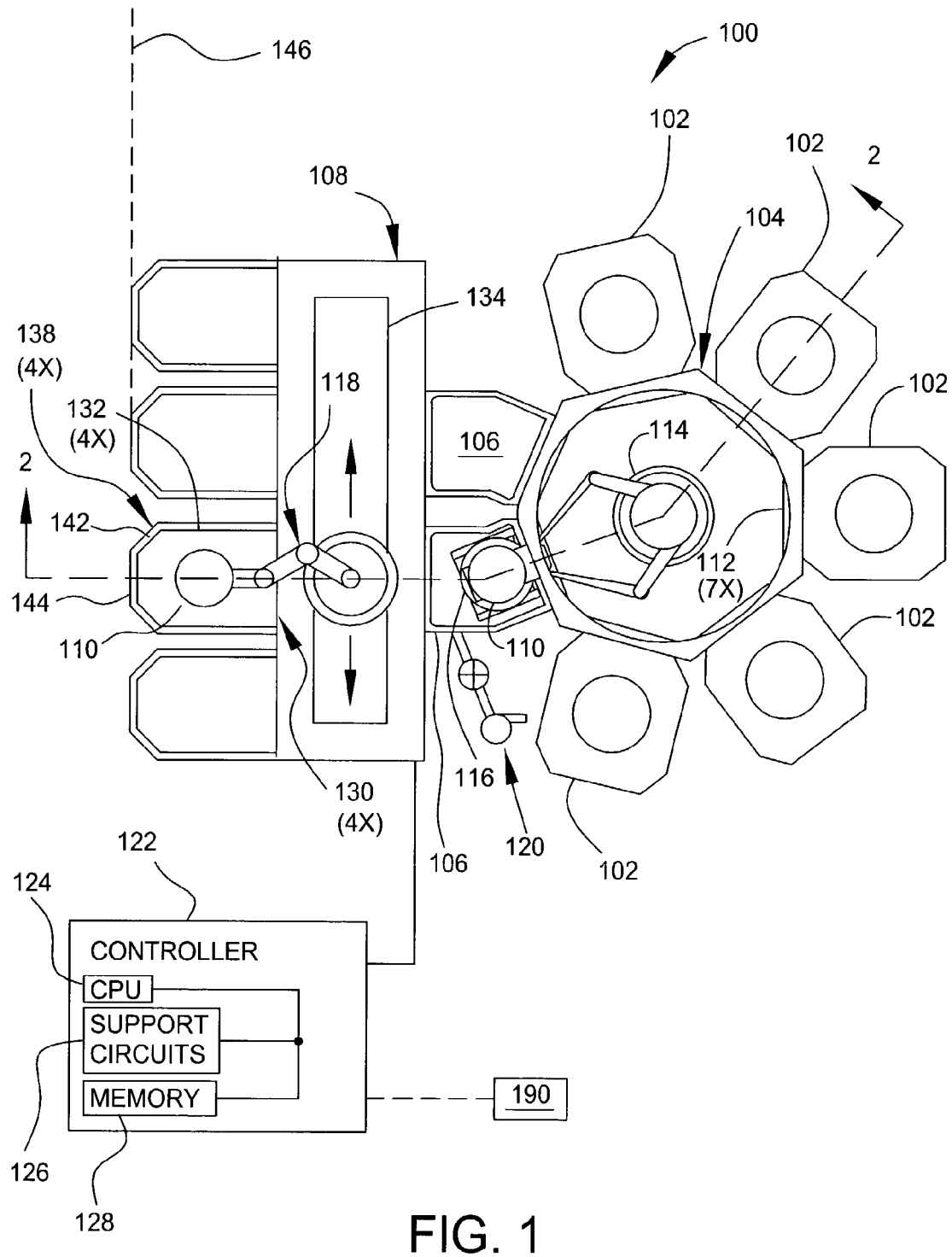
FIG. 1 is a top view of a cluster tool.
Figure 2:
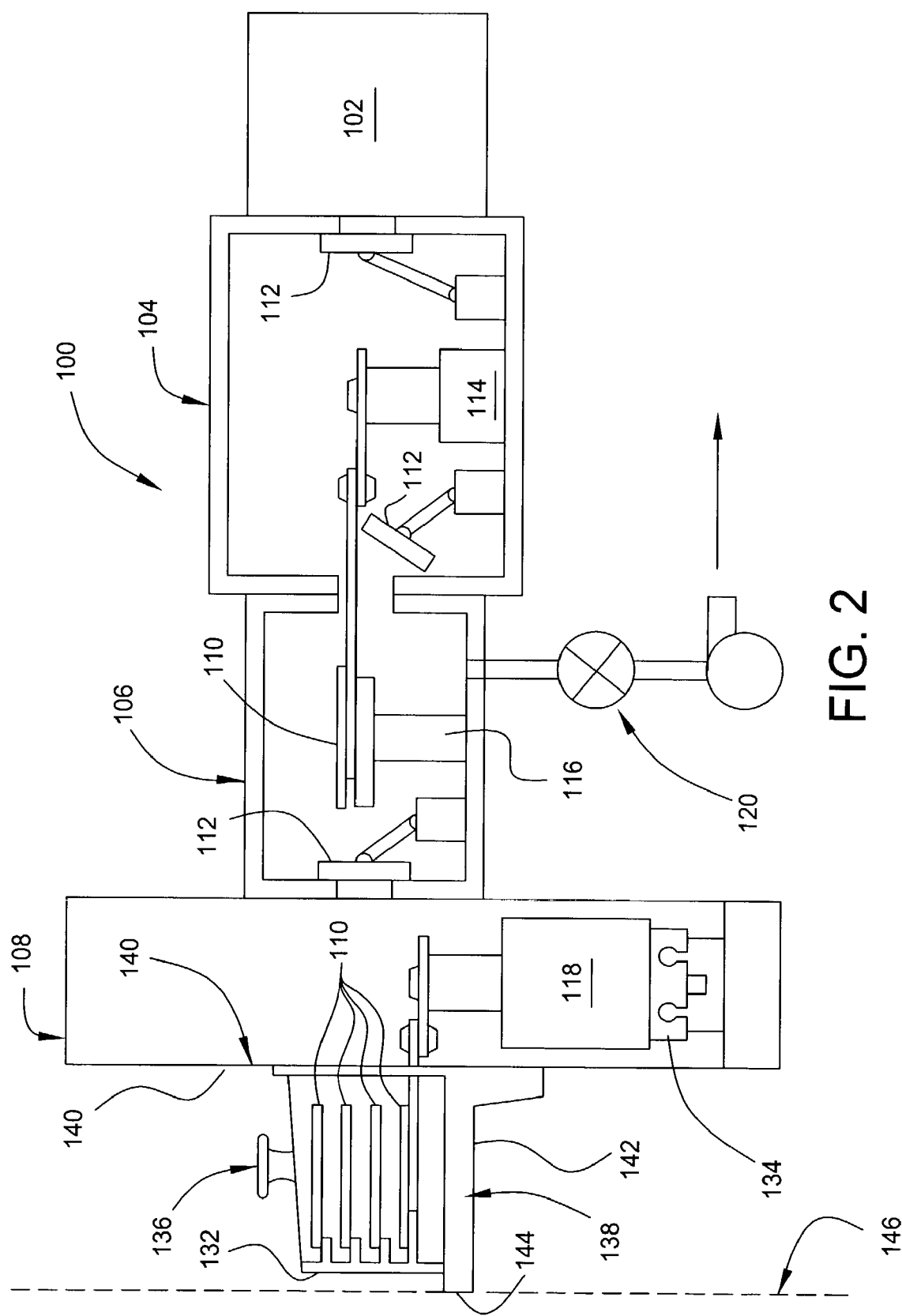
FIG. 2 is a sectional view of the cluster tool of FIG. 1.

FIGS. 1 and 2 depict sectional and top views of a cluster tool 100. The cluster tool 100 includes a plurality of processing chambers 102 coupled to a transfer chamber 104 that is connected to a factory interface 108 by one or more load lock chambers 106. The cluster tool 100 includes a system for preventing damage to substrates. Although the system for preventing damage to substrates is described as residing in the factory interface 108, the system may be employed in other areas of the cluster tool 100, or on other tools for processing substrates.

The transfer chamber 104 generally has one or more centrally disposed transfer robots 114 disposed therein. The transfer robot 114 is adapted to transfer substrates 110 between the load lock chamber 106 and the processing chambers 102 that are circumferentially coupled to the transfer chamber 104. Slit valves 112 are typically disposed within the transfer chamber 104 to selectively isolate the transfer chamber 104 from the load lock chamber 106 and the circumscribing process chambers. The valves 112 facilitate maintaining a vacuum environment within the transfer chamber 104 and providing process isolation for the processing chambers 102. Examples of commercially available platforms that have transfer chambers include the PRODUCER®, CENTURA® and ENDURA®, families of processing platforms, all available from Applied Materials, Inc. located in Santa Clara, Calif.

The processing chambers 102 circumscribing the transfer chamber 104 may be any variety of chambers suitable to perform the processes desired to fabricate at least a portion of a predefined structure upon the substrate 110. These chambers include, but are not limited to, etch chambers, chemical vapor deposition chambers, physical vapor deposition chambers, pre-clean chambers, orientators, metrology chambers, orientation chambers, and de-gas chambers, among others. Processing chambers of these types are commercially available from a number of sources, including Applied Materials, Inc.

The load lock chamber 106 is generally coupled between the transfer chamber 104 and the factory interface 108. The load lock chamber 106 facilitates transfer of the substrates 110 between the vacuum environment of the transfer chamber 104 and a substantially atmospheric environment of the factory interface 108. The load lock chamber 106 generally includes a substrate support 116 disposed within the load lock chamber 106. Substrate support 116 is configured to facilitate hand-off between the transfer robot 114 and an interface robot 118 disposed in the factory interface 108. As an example of operation of one load lock chamber 106, a slit valve 112 disposed between the factory interface 108 and transfer chamber 104 is opened to allow the interface robot 118 to transfer a substrate 110 from the factory interface 108 to the substrate support 116. The interface robot 118 is withdrawn from the load lock chamber 106 and the slit valve 112 is closed. An atmosphere control system 120 coupled to the load lock chamber 106 evacuates the load lock chamber 106 to a vacuum level substantially equal to that of the process transfer chamber 104. The slit valve 112 between the transfer chamber 104 and the load lock chamber 106 is then opened to allow the transfer robot 114 to retrieve the substrate 110 for processing. A processed substrate is then placed on the substrate support 116 by the transfer robot 114. The transfer robot 114 is withdrawn from the load lock chamber 106, and the slit valve 112 is closed. The atmosphere control system 120 then raises the pressure within the load lock chamber 106 to essentially that of the factory interface 108. The slit valve 112 between the load lock chamber 106 and the factory interface 108 is then opened, allowing the processed substrate 110 to be retrieved by the factory interface robot 118 from the substrate support 116 and returned to the factory interface 108. One load lock chamber that may be adapted to benefit from the invention is described in U.S. patent application Ser. No. 09/599,125, filed Jun. 22, 2000 by Cheung, et al. and is hereby incorporated by reference in its entirety.

A controller 122 is coupled to the tool 100 to control substrate movement and processing. The controller 122 includes a central processing unit (CPU) 124, support circuits 126 and memory 128. The CPU 124 may be one of any form of computer processor that can be used in an industrial setting for controlling various chambers and subprocessors. The memory 128 is coupled to the CPU 124. The memory 128, or computer-readable medium, may be one or more of readily available memory such as random access memory (RAM), read only memory (ROM), floppy disk, hard disk, or any other form of digital storage, local or remote. The support circuits 126 are coupled to the CPU 124 for supporting the processor in a conventional manner. These circuits include cache, power supplies, clock circuits, input/output circuitry, subsystems, and the like.

The factory interface 108 includes a plurality of bays 130 disposed opposite the load lock chamber 106. A substrate storage pod 132 is coupled to each bay 130. Each pod 132 stores a plurality of substrates 110 that are transferred between the load lock chamber 106 and the pod 132 by the interface robot 118. The interface robot 118 may be mounted on a rail 134 that allows the interface robot 118 to move within the factory interface 108, facilitating access of the pods 132 by the robot 118.

The pod 132 is typically a front opening unified pod (FOUP) adapted to retain a plurality of substrates therein. The pod 132 may include a flange 136 that facilitates handling and transport of the pod 132 by an automatic carrier apparatus 136, such as an auto-guided vehicle (AGV) commonly used in FABS to transfer pods 132 between cluster tools and the like.

A pod door opener (PDO) 138 is coupled to each bay 130 and supports the pod 132 while coupled to the factory interface 108. The PDO is configured to sealingly mate with the pod 132. In one embodiment, the PDO 138 is configured to conform to specifications set forth in SEMI Specification No. E57-1296, which is hereby incorporated by reference in its entirety. One PDO that may be adapted to benefit from the invention is described in U.S. Pat. No. 6,082,951, issued Jul. 4, 2000 to Nering et al., which is hereby incorporated by reference in its entirety. The PDO 138 may alternatively be configured to other standards or specifications. The PDO 138 generally includes a vertical docking station 140 (see in FIG. 2) coupled to a horizontal flange 142. The docking station 140 is coupled to the bay 130. The flange 142 extends from the docking station 140 to a distal end 144 orientated along an imaginary line 146. The imaginary line 146 is defined by SEMI Specification No. E-15.1.

Figure 3:
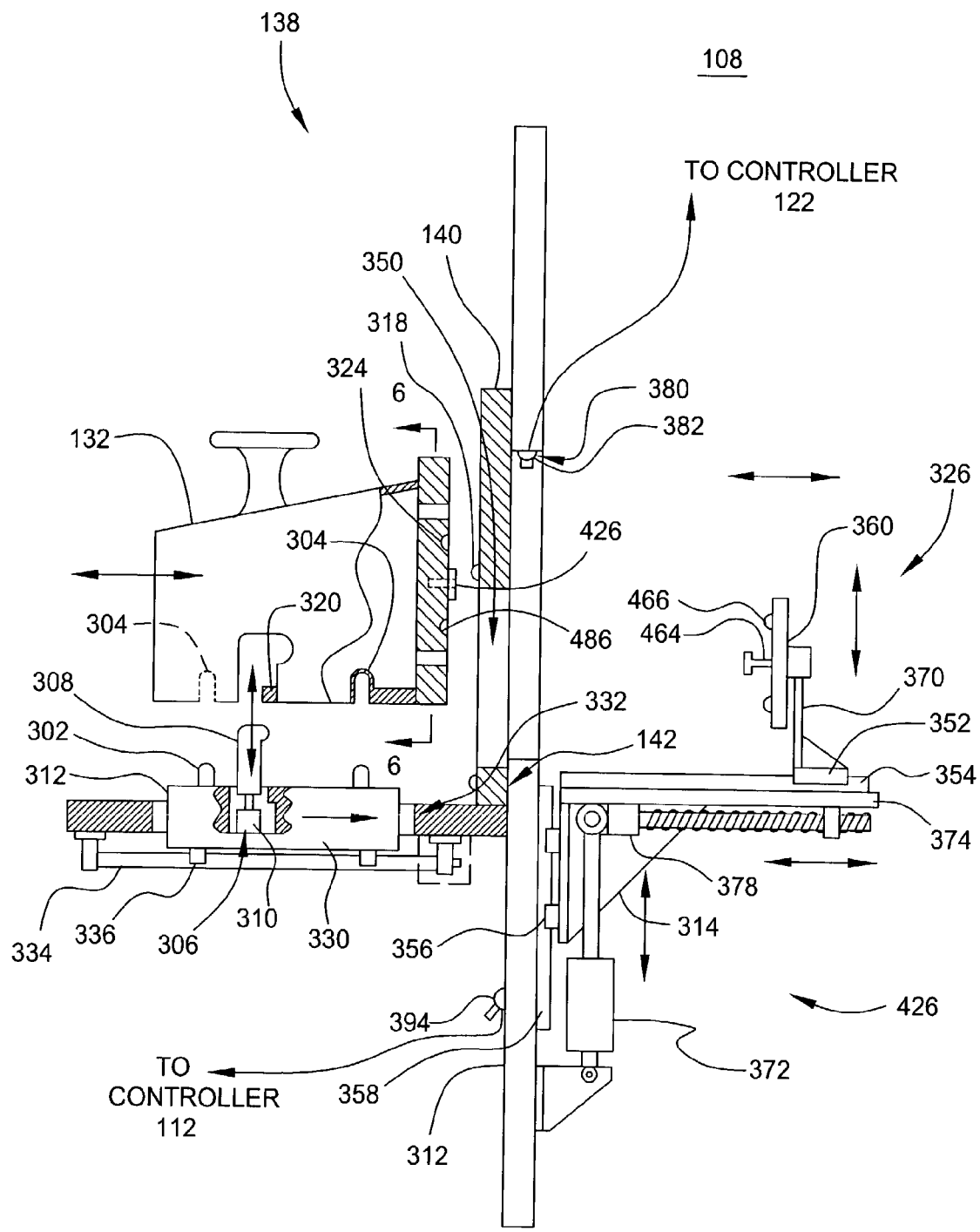
FIG. 3 is an elevation of one embodiment of a pod door opener.

FIG. 3 depicts one embodiment of the PDO 138 in greater detail. The flange 142 of the PDO 138 has an aperture or window 332 formed therethrough. A stage 330 is disposed in the window 332 of the flange 142. The stage 330 and flange 142 are typically parallel to each other. Bearing rails 334 are coupled to the flange 142 across or along side the window 332. Guides 336, coupled to the stage 330, are slidably mounted to the bearing rails 334 to allow the stage 330 to move laterally within the window 332.

The stage 330 includes a plurality of pins 302 and a clamp mechanism 306. The pins 302 project above an upper surface 312 of the stage 330 and are arranged to mate with a receiving hole 304 formed in the bottom of the pod 132. The pins 302 and holes 304 allow the pod 132 to be precisely and repeatably positioned on the stage 330.

The clamp mechanism 306 includes a hook 308 coupled to a clamp actuator 310. The hook 308 extends above the upper surface 312 of the flange 142, and is actuated by the clamp actuator 310 to engage a tab 320 formed in the bottom of the pod 130. The clamp actuator 310 may be actuated to retract the hook 308, thus engaging the tab 320 and urging the pod 132 against the stage 330. In one embodiment, the clamp actuator 310 is a pneumatic cylinder, but may alternatively be a ball screw, solenoid or any other type of linear actuator.

Figure 4:
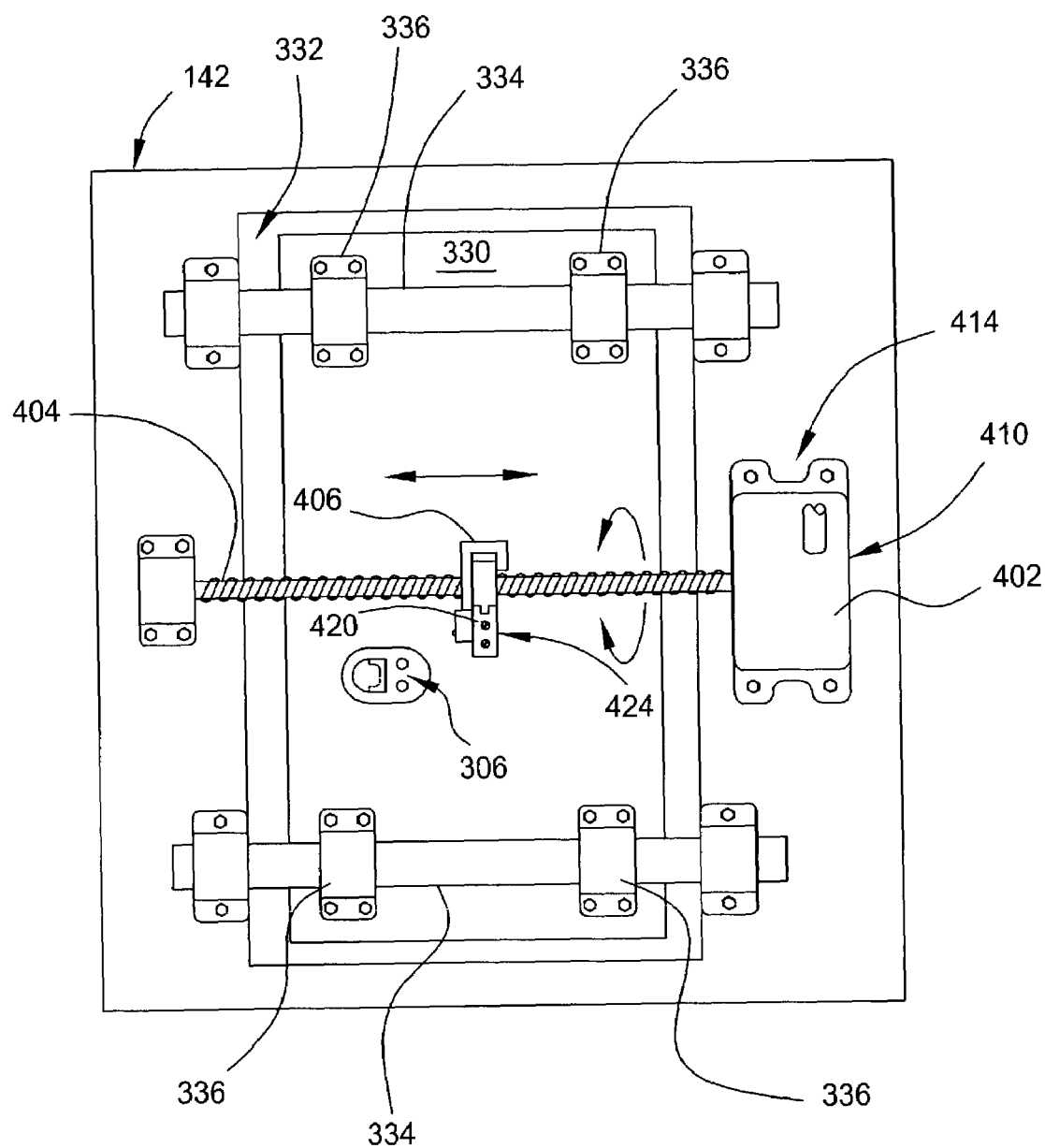
FIG. 4 is a bottom view of the pod door opener of FIG. 3.

FIG. 4 depicts a bottom view of the flange 142 of the PDO 138. A docking mechanism 414 is coupled between the flange 142 and the stage 330. The docking mechanism 414 includes docking actuator 410 that is adapted to controllably position the stage 330 within the window 332, thus allowing the pod 132 to be moved into and out of the docking station 140. In one embodiment, the docking actuator 410 includes a motor 402, a lead screw 404 and a nut 406. The motor 402 is coupled to the flange 142 and drives the lead screw 404. The nut 406 is engaged with the lead screw 404. A bracket 420 that extends from a bottom surface 422 of the stage 330 and is coupled to or captures the nut 406 by a release mechanism 424. The release mechanism 424 prevents the nut 406 from rotating. In response to a signal from the controller 122, the motor 402 rotates the lead screw 404 thereby causing the nut 406 to move along the lead screw 404. As the release mechanism 424 also fixes the nut 406 to the bracket 420, the rotation of the lead screw 404 causes the nut 406 to urge the stage 330 into motion, thereby positioning the stage 330 relative to the flange 142 (and docking station 140). Alternatively, the release mechanism may be utilized to disengage the clamp mechanism 306 from the pod 132.

Figure 5:
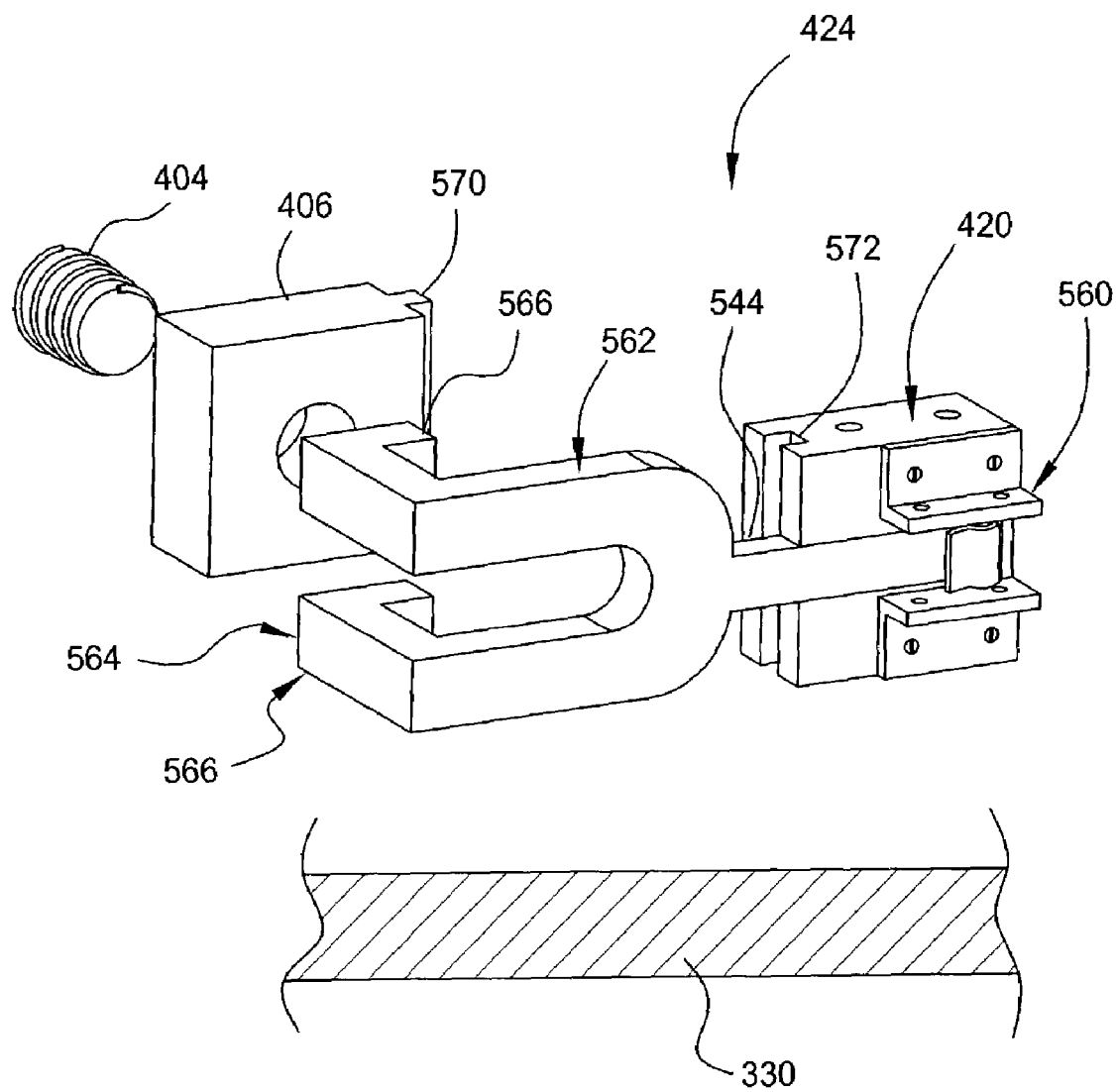
FIG. 5 is a perspective view of one embodiment of a release mechanism.

FIG. 5 depicts one embodiment of the release mechanism 424 that includes an over-center clamp 560 that actuates a forked draw 562. The draw 562 is coupled to the clamp 560 at a first end 544 and is bifurcated at a second opposing end 564 into a pair of hooked tines 566. The tines 566 of the draw 562 straddle the lead screw 404 while capturing the nut 406. As the clamp 560 is actuated to retract the draw 564, the nut 406, captured by the tines 466, is urged securely against the bracket 420. The nut 406 may include a key 570 extending from a side of the nut 406 facing the bracket 420. The key 570 is configured to mate with a slot 572 formed in the bracket 420 to enhance unitary movement of the nut 404 with the bracket 420.

In the advent of power failure, the release mechanism 424 may be actuated to disengage the stage 330 from the docking actuator 310 by opening the clamp 560 to disengage the tines 566 from the nut 406, thereby allowing stage 330 carrying the pod 132 to be manually moved away from the factory interface 108 without damage to the docking actuator 310 or other system components. Other types of release mechanisms are alternatively envisioned, for example, quick pins, lynch pins, clevis pins, dowel pins, quarter-turn fasteners, quick release fasteners, clamps, latches and locks among others. 20. The release mechanism may alternatively be an electro-mechanical device or a pneumatic device.

Returning to FIG. 3, the docking station 140 includes an aperture 350 formed therethrough to allow substrates to be transferred through a door 324 of the pod 132 into the factory interface 108. To isolate the factory interface 108 and substrates within the pod 132 from the environment outside the factory interface 106, a seal 318 is disposed between the docking station 140 and a front end 322 of the pod 130 in which the door 324 is formed. The seal 318 circumscribes the door 324 disposed in the front end 322 of the pod 130 and is sealingly compressed as the pod 132 is urged against the docking station 140 so that the factory interface 108 and pod 132 are isolated from the surrounding environment once the pod 132 is docked and the door 324 of the pod 132 opened.

Figure 6:
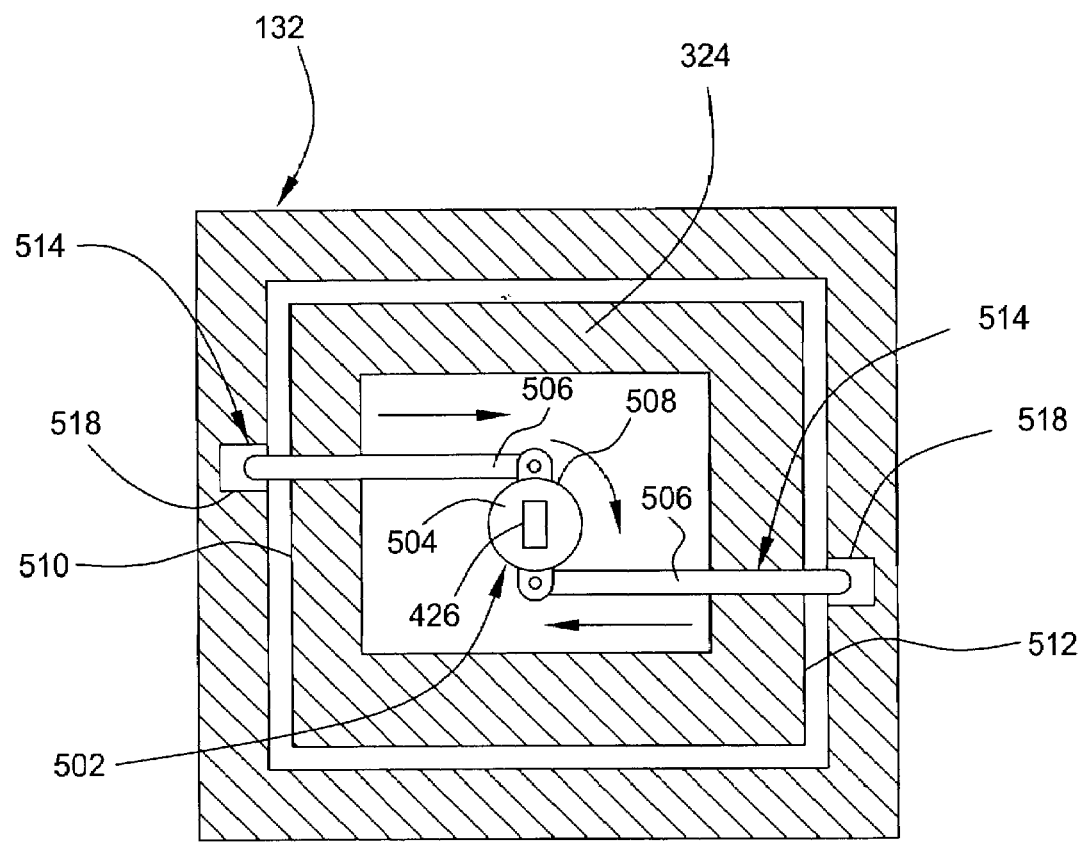
FIG. 6 is a sectional view of one embodiment of a pod door.

FIG. 6 depicts a sectional view of one embodiment of the pod door 324 taken along section line 6—6 of FIG. 3. The pod door 324 generally includes one or more locking mechanisms 602 for sealing securing the door 324 to the pod 132. The locking mechanism 602 includes a cylinder 604 rotatably coupled to the door 324. A plurality of latches 606 are coupled to a perimeter 608 of the cylinder 604. The latches 606 pass through guides 614 coupled to or formed in adjacent opposing sides 610, 612 of the door 324. The cylinder 604 has a key hole 368 in which a key 364 (shown in FIG. 3) may be inserted to rotate the cylinder 604. The cylinder 604 may be rotated in a first direction to retract the latches 606 into the door 324, or rotated a second direction to extend the latches 606 beyond the sides 610, 612 of the door 324 (as shown in FIG. 6). When extended, the latches 606 engage slots 618, 616 formed in the pod 132 to sealingly couple the door 324 to the pod 132.

Returning to FIG. 3, an opening mechanism 326 is disposed within the factory interface 108 and is utilized to unlock and open the door 324 of the pod 132. The opening mechanism 326 includes a receiving plate 360 coupled to the factory interface 108 by an opening actuator 372. The receiving plate 360 includes a key 464 and plurality of pins 466. The opening actuator 372 moves the receiving plate 360 to a first position adjacent the door 324 The pins 466 mate with respective holes 486 formed in the pod door 324, thereby aligning the receiving plate 360 with the door 324.

The key 464 is insert into the key hole 426 formed in the cylinder 304 of the door 324. The key 464 is rotated by a key actuator 370 to unlock the door 324 from the pod 132. The key actuator 370 is coupled to the receiving plate 360 and may be adapted to selectively rotate the key 464. For example, the key actuator 370 may be a rotary solenoid, stepper motor, pneumatic cylinder, rotary or linear actuator among others. The key 464 typically has a tee or other feature that retains the door 324 to the receiving plate 360 as The door 324 is moved away from the aperture 350 to facilitate unobstructed substrate transfer between the pod 132 and factory interface 108.

In one embodiment, the opening actuator 362 has a two-step motion for moving the door 324 away from the aperture 350. In an opening motion, the door 324, secured to the receiving plate 360, is retracted laterally into the factory interface 108 in a first step then lowered away from the aperture 350 in a second step. The retraction motion of the first step is typically parallel to the orientation of the substrates within the pod 132 and the upper surface 312 of the stage 330 (i.e., perpendicular to a centerline of the substrates within the pod 132). Alternatively, the second step may move the door 324 laterally to the side of the aperture 350 (i.e., perpendicularly to the retraction motion and parallel to the upper surface 312 of the stage 330 and flange 142). The door 324 is returned to the pod 132 in a closing motion opposite the motion described above.

The two-step motion of the opening actuator 362 advantageously allows substrates that may be partially extended from the pod 132 to be returned to the proper position within the pod 132 by utilizing the pod door 324 to gently push the substrates laterally into the pod 132. As the final closing motion of the pod door 324 is parallel to the orientation of the substrates within the pod 132, the substrates are pushed substantially within their plane thereby minimizing potential scratching or other damage which may be created if one of the flat surfaces of the substrate was urged, or rubbed against the system as the substrate is slide back into the pod 132. The door 324 is then re-opened to allow processing and substrate transfer to continue without interruption.

The two-step motion of the opening actuator 362 may be realized by a linkage that provides the requisite motion, by one or more actuators adapted to control the motion of the receiving plate 360, or a combination thereof. In the embodiment depicted in FIG. 3, the opening actuator 362 includes a first actuator 378 for controlling motion into and out of the aperture 350, and a second actuator 372 for controlling motion vertically towards and away from the aperture 350.

The first actuator 378 is coupled between a base plate 374 and the receiving plate 360. The first actuator 378 is typically a ball screw and motor, but may alternatively be any other device for facilitating linear motion of the receiving plate 360 relative to the base plate 374. Bearings 352, mounted to a stanchion 376 the receiving plate 360, ride along guide rails 354 coupled to the base plate 374 to ensure smooth controlled motion between the receiving plate 360 and base plate 374. Thus, the first actuator 378 enables horizontal positioning of the receiving plate 360 (and pod door 324 when coupled thereto) into and out of the aperture 350.

The second actuator 372 is coupled between the base plate 374 and a frame 312 or other structural element of the factory interface 108. The second actuator 372 is typically configured similar to the first actuator 378. A truss plate 314 is coupled to the base plate 374 to provide a stable attachment point for bearings 356 that provide vertical movement of the base plate 374 along guide rails 358 coupled to the frame 312. Thus, the second actuator 378 enables the pod door 324, while attached to the receiving plate 360, to be lowered clear of the aperture 360, thereby allowing substrate transfer between the pod 328 and factory interface 108 to occur unobstructed.

A first sensor 380 is typically coupled to the factory interface 108 proximate the aperture 350. The first sensor 380 is typically adapted to detect misaligned substrates sticking out from their proper positioned within the pod 132 into the aperture 350. Substrates may become misaligned for a variety of reasons, including by not limited to vibrations, incidental contact, sticking to the pod door 324 during opening and seismic events among others. Once the first sensor 380 provides the controller 122 with a signal indicative of one or more misaligned substrate extending into the aperture 350, the pod door 324 may be closed to return the substrates to their proper position within the pod 132. Advantageously, the two-step motion of the opening actuator 362 allows for the substrates to be re-positioned within the pod 132 without disrupting system operations by opening the factory interface to manually retrieve the substrates.

In one embodiment, the first sensor 380 is a vision system adapted to view the aperture 350. The vision system includes a camera 382 having a field of view encompassing the entire aperture 350. Images of the aperture 350 are captured by the camera 382 and provided to the controller 122 for processing. The images may be transferred between the controller 122 and camera 382 by hard-wire or wire-less signal.

The images can be interpreted manually or automatically to determine if the substrates, viewed in the image, are positioned where potential damage may occur. In one embodiment, the images are compared to reference images stored in the memory 128 of the controller 122. If the captured image fails to compare favorably to a reference image of a clear aperture 350 (i.e., no substrates protruding into the aperture 350), the controller 122 then instructs the opening actuator 362 to return the door 324 to the pod 132 to re-align the substrates. The door 324 is then re-opened to allow processing and substrate transfer to continue without interruption. Alternatively, the images may be viewed on a monitor (not shown) for manual interpretation.

The controller 122 may also close the pod door 132 preventatively or in response to a signal indicative of an impending or occurring event. For example, the controller 122 may receive information from a seismic warning system 190 (shown in FIG. 1) which issues a signal indicative of a probable, impending or forecasted seismic event which could cause substrates to inadvertently move from the pod 132 into the factory interface 108. In response to a signal from the seismic warning system 190, the controller 122 instructs the pod door 132 to be closed, thereby securing the substrates within the pod 132. The controller 122 may additionally cease or suspend other operational activities, for example, substrate processing or substrate transfer in response to information received from the seismic warning system 190. Alternatively, the system 100 may suspend future processing or substrate transfers, and move substrates within the system 100 to predetermined locations where damage may be minimized during seismic activity.

The seismic warning system 190 may be remote to the controller 122, such as a network, run by a local, state or Federal agency, or may be a private or corporate enterprise that issues a signal or other data, available to the controller 122 via hardwire or wireless communication, based on current or forecasted seismic or other emergency condition. Emergency conditions may include, but are not limited to, weather conditions, geological events, impending power loss or voltage reduction, fire, utility interruption; terrorism, warfare, social unrest, flooding, other natural or civil disasters, or other event where it would be advantageous to cease substrate processing. Alternatively, the seismic warning system 190 may be coupled to the controller 122, or mounted to, or nearby the system 100. For example, the seismic warning system 190 may be an accelerometer or other type of sensor adapted to detect seismic motion, fire or voltage loss. In one embodiment, the seismic warning system 190 is an accelerometer adapted to detect vibration in excess of a predefined level. The excess vibration may be due to seismic activity or other event. In another embodiment, a manual switch 394 may be coupled to the system 100 signals the controller 122 to instruct the pod door 132 to be closed.

Figure 7:
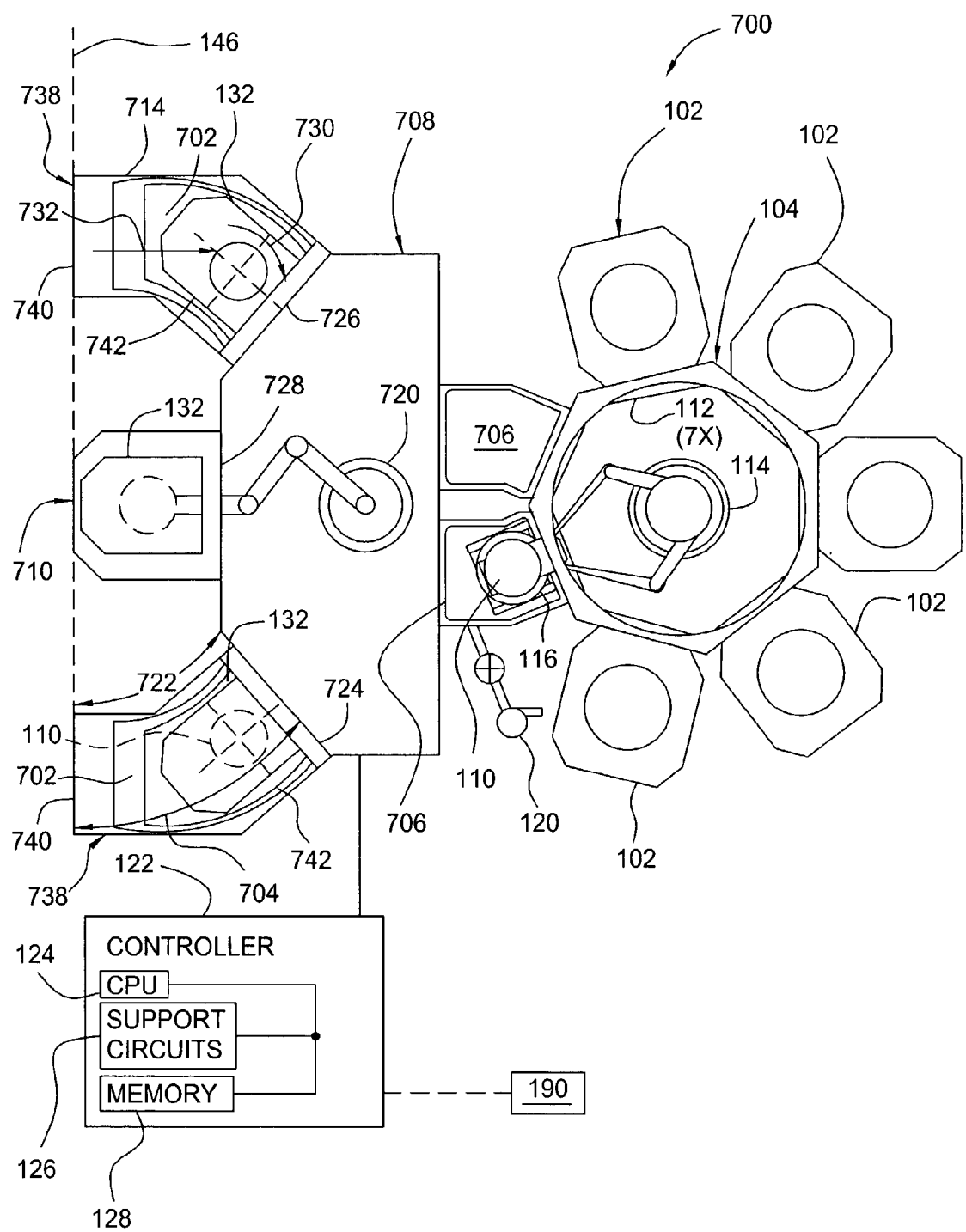
FIG. 7 is an elevation of another embodiment of a pod door opener.

FIG. 7 depicts top plan view of another embodiment of a processing system 700. The system 700 includes processing chambers 102 and a transfer chamber 104 that are configured similar those of the processing system 100 described above. The system 700 additionally includes curved or faceted factory interface 708 coupled to the transfer chamber 104 by a pair of load lock chambers 106. The factory interface 708 has a center pod door opener (PDO) 710 and two outer PDOs 738 coupled thereto opposite the load lock chambers 106. The processing system 700 has compact footprint provided by the factory interface 708 that facilitates utilization of a fixed position robot 720 in the factory interface 708 that interfaces with the three PDOs 710, 738. As the fixed position robot 720 disposed in the factory interface 708 does not require lateral movement within the factory interface 708 to transfer substrates with all three pods 132 disposed on the PDOs 710, 738, a cost savings is realized as compared with other processing systems that require a mobile factory interface robot to accommodate substrate transfer from more than two pods.

The center PDO 710 coupled to a first facet 728 of the factory interface 708 and is configured similar to the PDO 138 described above. The center PDO 710 is disposed inline with the robot 720 and transfer chamber 104.

The offset PDOs 738 are coupled to a second and third facets 724, 726 disposed to either side of the first facet 724 and center PDO 710. The PDO 738 is also configured similar to the PDO 138 described above, having a flange 740 and a docking station 742, except that a stage 702 of the PDO 738 has a non-linear docking motion as shown by arrow 704.

The non-linear docking motion allows the pod 132, placed on the PDO 738 by an AGV in an orientation squared to the SEMI-line 146, to rotate through an angle 722 to mate a docking station 742 of the PDO 738. In embodiment, the angle 722 ranges between about 30 to about 60 degrees. Each docking station 742 is coupled in a parallel orientation to respective facets 724, 726 of the factory interface 708. The docking station 742 and facet 724 are typically disposed at the same angle 722 relative to the SEMI-line 146 (e.g., the facets 724, 726 and SEMI-line 146 are non-parallel). As the non-linear docking motion of the PDO 738 allows the pod 132 to be disposed closer to the robot 720 than conventional factory interfaces that are parallel to the SEMI-line 146, the system 700 utilizing the PDO 738 does not require lateral movement of the robot 710 to reach all the pods 132, thereby eliminating a degree of freedom required for substrate transfer and reducing robot and factory interface costs over conventional systems. Although the motion of the stage 702 is described below as having a curved motion, the non-linear motion of the stage 702 is contemplated as any combination of motions which results in a pod docking motion having at least one motion component perpendicular to the SEMI-line 146 and a rotational component about an axis perpendicular to the SEMI-line 146 and plane defined by a upper surface 714 of the stage 702 as shown by arrows 730, 732, respectively. The axis of rotation is typically a central axis of the pod 132, or offset and parallel thereto.

Figure 8:
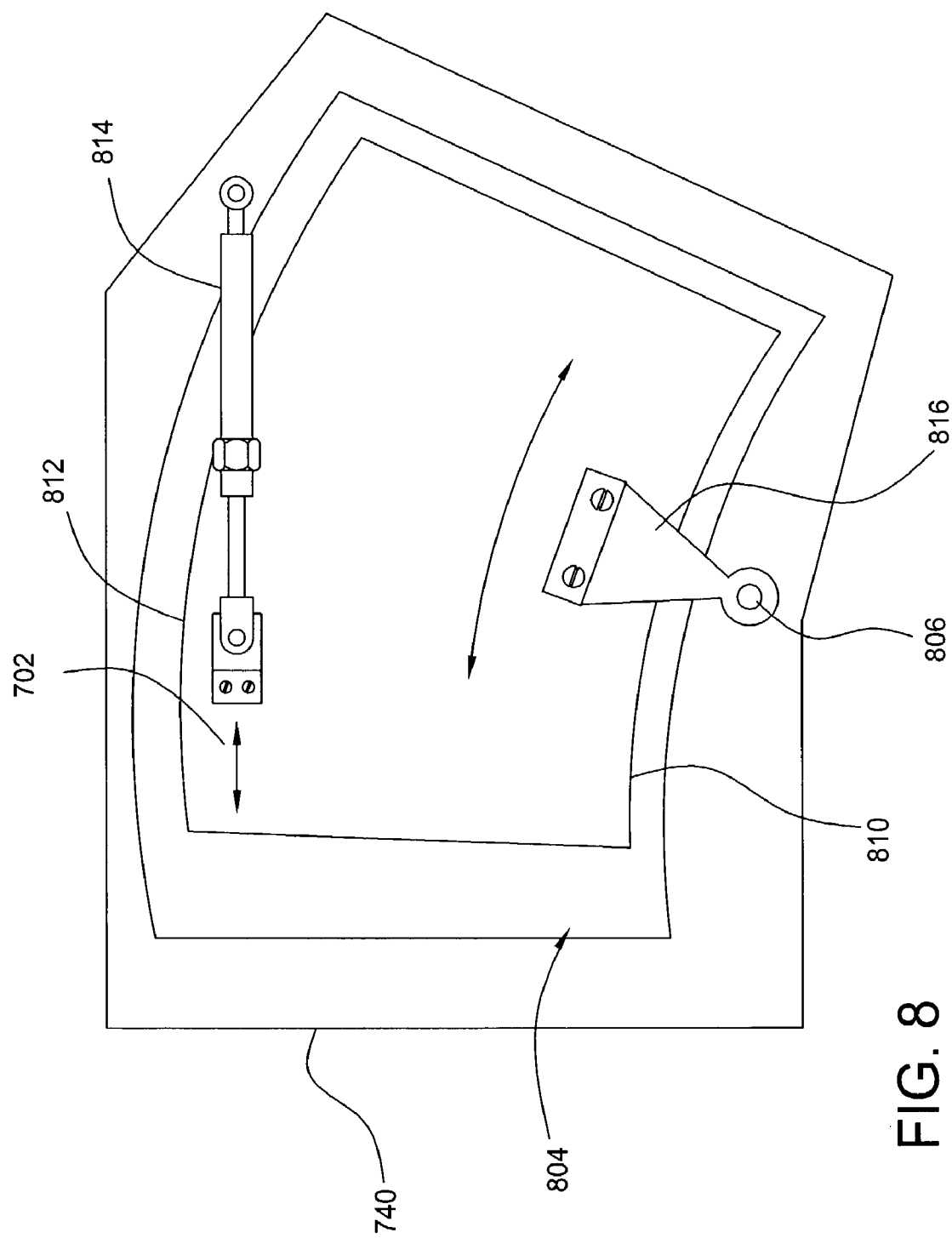
FIG. 8 is a bottom view of the pod door opener of FIG. 7.

FIG. 8 depicts bottom plan view of the PDO 738. The flange 740 of the PDO 738 has a window 804 in which the stage 702 is moved in a non-linear motion. It is contemplated that the non-linear motion may comprise two linear motions, each having a unique direction, or combination of a linear motion and rotational motion, among other possibilities. The stage 702 has a first end 810 and a second end 812. The first end 810 of the stage 702 has a bracket 816 coupled thereto. The bracket 816 is coupled to the flange 740 at a pivot point 806, thereby allowing the stage 702 to rotate within the window 804. In one embodiment, the ends 810, 812 are offset at different radii about the pivot point 806. Bearing and guides (not shown) are typically disposed between the stage 702 and flange 740 to facilitate smooth, repeatable motion.

The second end 812 of the stage 702 is coupled to a stage actuator 814. The stage actuator 814 may be any rotational or linear actuation device capable of imparting motion between the stage 702 and flange 740, and in one embodiment, is a pneumatic cylinder. The stage actuator 814 may be instructed by a controller 122 to pivot the stage 702 about the pivot point 740, moving the stage 702 as indicated by the arrow 704. As the stage 702 moves, the pod 132, secured to the stage 702 in a manner similar to as described above with reference to FIG. 3, is sealingly docked to the factory interface 708.

Thus, a system is provided that prevents damage to substrates in the factory interface. Moreover, the system allows alignment correction of substrates to occur without interrupting processing. Additionally, in one embodiment provides a system having a compact footprint that reduces the cost of ownership associated with large processing systems.

While the foregoing is directed to the some embodiments of the present invention, other and further embodiments of the invention may be devised without departing from the basic scope thereof, and the scope thereof is determined by the claims that follow.

What is claimed is:

1. A method for preventing substrate damage in a factory interface comprising:
   receiving an indicia of potential substrate damage; and
   automatically closing a pod door to a pod to prevent substrates from moving out of a substrate storage cassette positioned in the pod in response to the received indicia.

2. The method of claim 1, wherein the step of receiving the indicia further comprises:
   sensing one or more substrates extending between a substrate storage pod and the factory interface.

3. The method of claim 2, wherein the step of sensing substrates further comprises:
   interpreting an image received from a camera disposed in the factory interface.

4. The method of claim 1, wherein the step of receiving an indicia further comprises:
   sensing a seismic event.

5. The method of claim 4, wherein the step of sensing a seismic event further comprises:
   receiving a signal from a seismic warning network.

6. The step of claim 4, wherein the step of sensing the seismic event further comprises:
   detecting motion at the factory interface.

7. The step of claim 6, wherein the step of detecting motion at the factory interface further comprises
   receiving a signal from an accelerometer.

8. The method of claim 1, wherein the step of receiving an indicia further comprises:
   receiving information regarding a current or forecasted event selected from the group events consisting of weather events, geological events, power loss, voltage reduction, fire, utility interruption, terrorism, warfare, social or civil unrest and flooding.

9. The method of claim 1, wherein the step of preventing one or more substrates from moving out of the cassette further comprises:
   pushing substrates back into the cassette.

10. The method of claim 1, wherein the step of closing the pod door further comprises moving the pod door in a direction perpendicular to a centerline of pod.

11. A method for preventing substrate damage in a factory interface comprising:
    moving a pod door in a first direction to a position spaced-apart and adjacent a pod; and
    moving the pod door laterally in a second direction to close the pod in response to an indicia of potential substrate damage.

12. The method of claim 11, wherein the steps of moving the pod door are made in response to substrates being misaligned in the pod.

13. The method of claim 12, wherein the step of moving the pod door returns the misaligned substrates to a predefined position within the pod.

14. A method for preventing substrate damage in processing system comprising:
  receiving information regarding seismic activity; and
  automatically closing a door of a pod in response to the received information.

15. The method of claim 14, wherein the step of receiving information further comprises:
  receiving a signal from a seismic alert network.

16. The method of claim 14, wherein the step of receiving information further comprises:
  receiving a signal from an accelerometer coupled to the processing system.

17. A method for preventing substrate damage in a factory interface comprising:
  receiving a signal from a seismic warning network; and
  taking action to prevent substrate damage in response to the signal, wherein the step of taking action further comprises closing a pod door to a pod to prevent substrates from moving out of a substrate storage cassette.

* * * * *